United States Patent
Wang

(10) Patent No.: US 11,289,672 B2
(45) Date of Patent: Mar. 29, 2022

(54) ORGANIC LIGHT EMITTING DIODE DISPLAY DEVICE AND METHOD OF MANUFACTURING THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Shipan Wang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 329 days.

(21) Appl. No.: 16/615,166

(22) PCT Filed: Jul. 29, 2019

(86) PCT No.: PCT/CN2019/098087
§ 371 (c)(1),
(2) Date: Nov. 20, 2019

(87) PCT Pub. No.: WO2020/206874
PCT Pub. Date: Oct. 15, 2020

(65) Prior Publication Data
US 2022/0037610 A1    Feb. 3, 2022

(30) Foreign Application Priority Data

Apr. 8, 2019  (CN) .......................... 201910276697.8

(51) Int. Cl.
*H01L 51/52* (2006.01)
*H01L 51/50* (2006.01)
*H01L 51/00* (2006.01)
*H01L 51/56* (2006.01)

(52) U.S. Cl.
CPC .......... *H01L 51/52* (2013.01); *H01L 51/0007* (2013.01); *H01L 51/5072* (2013.01); *H01L 51/56* (2013.01)

(58) Field of Classification Search
CPC .. H01L 51/52; H01L 51/0007; H01L 51/5072
See application file for complete search history.

(56) References Cited

U.S. PATENT DOCUMENTS

2014/0206119 A1    7/2014 Kang

FOREIGN PATENT DOCUMENTS

| CN | 107177239 A | 9/2017 |
| CN | 109192885 A | 1/2019 |
| CN | 109378406 A | 2/2019 |

*Primary Examiner* — Anthony Ho
(74) *Attorney, Agent, or Firm* — Osha Bergman Watanabe & Burton LLP

(57) ABSTRACT

An organic light emitting diode display device and a method of manufacturing thereof are provided. An electron transport layer ink droplet is formed on a surface of the first solvent ink droplet by forming a first solvent ink droplet on a surface of the organic light emitting layer. Thus, the first solvent constituting the first solvent ink droplet and the second solvent of the electron transport layer ink droplet are evaporated to form the electron transport layer.

18 Claims, 2 Drawing Sheets

ORGANIC LIGHT EMITTING DIODE DISPLAY DEVICE AND METHOD OF MANUFACTURING THEREOF

BACKGROUND OF INVENTION

Field of Invention

The present invention relates to the filed of display technology, and more particularly, to an organic light emitting diode display device and a method of manufacturing thereof.

Description of Prior Art

Organic light emitting diode (OLED) displays are considered to have a series of outstanding advantages such as self-luminescence, high contrast, wide color gamut, wide viewing angles, fast response times, and flexible display, and thus become a most promising next-generation new flat panel display technology. Currently, an organic light emitting layer of commercially available OLED products is mainly manufactured by a high vacuum thermal evaporation method, and the organic light emitting layer manufactured by high vacuum thermal evaporation has the disadvantages of complicated equipment and process, high energy consumption, high material waste, and high cost. Printing display technology provides an effective way to produce high performance OLED products at low cost. Among them, ink-jet printing (IJP) technology greatly improves material utilization by injecting ink containing functional materials into an opening of the pixel definition layer. The ink-jet printing technology can effectively reduce costs, and it also has great advantages for manufacturing large-size OLED panels.

Currently, the hole injection layer, the hole transport layer, and the organic light emitting layer in the OLED are both formed through the ink-jet printing process, and the electron transport layer (ETL) and the cathode are still formed through an evaporation process. The main reason is that most of the electron transport layer is made of organic solvent-dissolved materials. The electron transport material is dissolved in an organic solvent and then it is sprayed onto the organic light emitting layer. Then, the organic solvent dissolves the organic light emitting layer so that a mutual dissolution phenomenon easily occurs between the organic light emitting material and the electron transport material, resulting in difficulty in manufacturing device of the whole solution process. In order to achieve a whole solution process, it is necessary to develop an electron transport material ink that is immiscible with the organic light emitting layer, but it is still a great challenge.

SUMMARY OF INVENTION

A method of manufacturing an organic light emitting diode display device includes following steps of:

providing a substrate having a plurality of pixel regions;

forming an organic light emitting layer on the pixel region of the substrate, and the organic light emitting layer includes an organic light emitting material;

forming a first solvent ink droplet on the organic light emitting layer, and the first solvent ink droplet includes a first solvent, and the organic light emitting material is insoluble or slightly soluble in the first solvent;

forming an electron transport layer ink droplet on the first solvent ink droplet, and the electron transport layer ink droplet includes an electron transport layer material and a second solvent; and vacuum drying and heating to volatilize the first solvent and the second solvent sequentially, and then forming an electron transport layer on the organic light emitting layer.

In one embodiment, the first solvent is a water-soluble organic solvent.

In one embodiment, and the water-soluble organic solvent is selected from at least one of a monohydric alcohol, a polyhydric alcohol, a monobasic acid, and a polybasic acid.

In one embodiment, the water-soluble organic solvent includes at least one of ethanol, n-propanol, ethylene glycol, and glycerol.

In one embodiment, the second solvent is selected from the group consisting of at least one of anisole, ethyl benzoate, benzyl alcohol, and cyclohexylbenzene.

In one embodiment, boiling point of the first solvent is higher than boiling point of the second solvent.

In one embodiment, the first solvent is glycerol and the second solvent is cyclohexylbenzene.

In one embodiment, the first solvent ink droplet is formed by spraying, and the electron transport layer ink droplet is formed by spraying.

In one embodiment, the first solvent is ethanol, and the second solvent is benzyl alcohol.

An organic light emitting diode display device includes:

a substrate having a plurality of pixel regions;

an organic light emitting layer formed on a pixel region of the substrate, and the organic light emitting layer includes an organic light emitting material; and an electron transport layer formed on the organic light emitting layer, and the electron transport layer forms a first solvent ink droplet through the organic light emitting layer, and an electron transport layer ink droplet is formed on the first solvent ink droplet by vacuum drying and heating the first solvent ink droplet and the electron transport layer ink droplet in sequentially to volatilize the first solvent of the first solvent ink droplet and the second solvent of the electron transport layer ink droplet, and the organic light emitting is insoluble or slightly soluble in the first solvent, and the electron transport layer ink droplet includes an electron transport layer material.

In one embodiment, the first solvent is a water-soluble organic solvent.

In one embodiment, the water-soluble organic solvent is selected from at least one of a monohydric alcohol, a polyhydric alcohol, a monobasic acid, and a polybasic acid.

In one embodiment, the water-soluble organic solvent includes at least one of ethanol, n-propanol, ethylene glycol, and glycerol.

In one embodiment, the second solvent is selected from at least one of anisole, ethyl benzoate, benzyl alcohol, and cyclohexylbenzene.

In one embodiment, boiling point of the first solvent is higher than boiling point of the second solvent.

In one embodiment, the first solvent is glycerol and the second solvent is cyclohexylbenzene.

In one embodiment, the first solvent ink droplet is formed by spraying, and the electron transport layer ink droplet is formed by spraying.

In one embodiment, the first solvent is ethanol, and the second solvent is benzyl alcohol.

An organic light emitting diode display device and a method of manufacturing thereof are provided. An electron transport layer ink droplet is formed on a surface of the first solvent ink droplet by forming a first solvent ink droplet on a surface of the organic light emitting layer. Thus, the first solvent constituting the first solvent ink droplet and the second solvent of the electron transport layer ink droplet are evaporated to form the electron transport layer. Since the organic light emitting material is insoluble or slightly soluble in the first solvent, the first solvent ink droplet acts as an isolation role between the organic light emitting layer and the electron transport layer ink droplet to prevent the organic light emitting material from being dissolved in the second solvent and mixed with the material of the electron transport layer.

Figure 1:
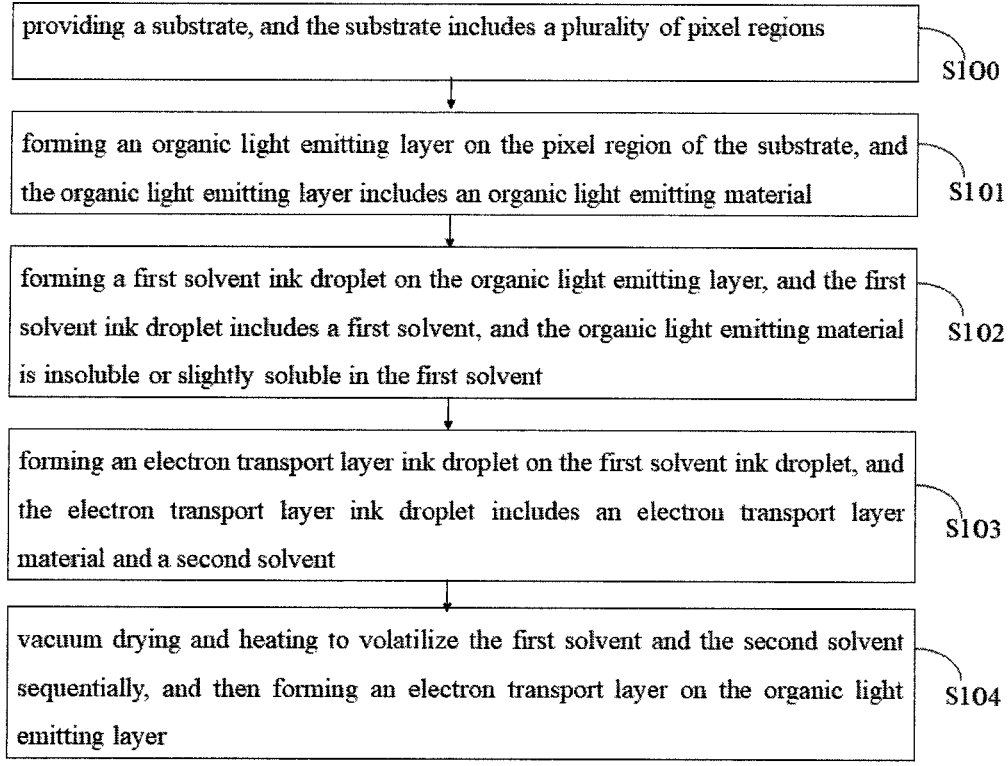
FIG. 1 is a flowchart of a method of manufacturing an organic light emitting diode display device according to one embodiment of the present invention.

ELEMENT REFERENCE substrate 10; pixel definition layer 11; opening 110; organic light emitting layer 12; first solvent ink droplet 13; electron transport layer ink droplet 14; and electron transport layer 15.

DETAILED DESCRIPTION OF PREFERRED EMBODIMENTS

The technical solutions in the embodiments of the present invention are clearly and completely described in the following with reference to the accompanying drawings. It is apparent that the described embodiments are only a part of the embodiments of the present invention, and not all of them. All other embodiments obtained by a person skilled in the art based on the embodiments of the present invention without creative efforts are within the scope of the present invention.

FIG. 1 is a flowchart of a method of manufacturing an organic light emitting diode display device according to one embodiment of the present invention. The method is described as follows.

Figure 2A:
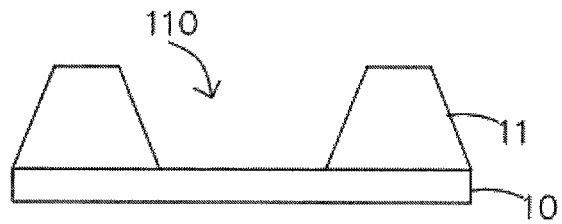
FIG. 2A to FIG. 2F are schematic views of a process for manufacturing an organic light emitting diode display device according to the flow chart shown in FIG. 1.

S100: referring to FIG. 2A, a substrate 10 is provided, and the substrate 10 includes a plurality of pixel regions.

Specifically, a pixel definition layer (PDL) 11 is disposed on the substrate 10. The pixel definition layer 11 has a plurality of openings 110. The openings 110 are disposed on the pixel regions of the substrate 10. The pixel definition layer 11 is made of an organic material. A thickness of the pixel definition layer 11 is 10,000 angstroms to 20,000 angstroms. An anode (not shown) and a thin film transistor layer (not shown) arranged in an array are also disposed on the substrate 10. The anode is disposed between the thin film transistor layer and the pixel definition layer 11.

Figure 2B:
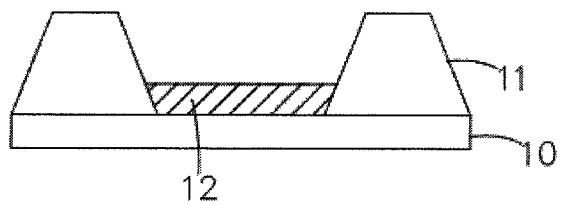

S101: referring to FIG. 2B, an organic light emitting layer 12 is formed on the pixel region of the substrate 10, and the organic light emitting layer 12 includes an organic light emitting material.

Specifically, the organic light emitting material is dissolved and dispersed in an oil-soluble organic solvent to prepare an organic light emitting material ink, and the organic light emitting material ink is formed in the opening 110 by inkjet printing, so an organic light emitting material ink droplet is formed, and then the oil-soluble organic solvent is removed by drying so as to form an organic light emitting layer 12. The organic light emitting material includes a red organic light emitting material, a green organic light emitting material, and a blue organic light emitting material. The oil-soluble organic solvent includes, but is not limited to, an aromatic benzene solvent such as anisole, ethyl benzoate, benzyl alcohol, and cyclohexylbenzene. It can be understood that a hole injection layer (IJL) and a hole transport layer (HTL) may be sequentially formed in the opening 110 before the organic light emitting layer 12 is formed in the opening 110.

Figure 2C:
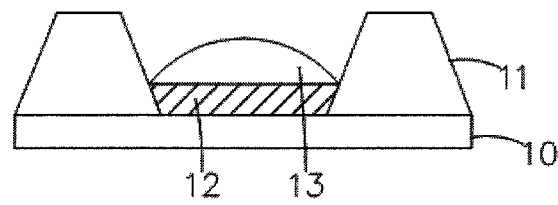

S102: referring to FIG. 2C, a first solvent ink droplet 13 is formed on the organic light emitting layer 12, and the first solvent ink droplet 13 includes a first solvent, and the organic light emitting material is insoluble or slightly soluble in the first solvent.

Specifically, the first solvent is sprayed onto the organic light emitting layer 12 by inkjet printing to form the first solvent ink droplet 13. In one embodiment, the first solvent is water-soluble organic solvent, and the water-soluble organic solvent includes, but is not limited to, a monohydric alcohol, a polyhydric alcohol, a monobasic acid, and a polybasic acid. The monohydric alcohol includes, but is not limited to, ethanol, n-propanol, and isopropanol. The polyhydric alcohol includes, but is not limited to, ethylene glycol, and glycerol, etc.

Since conventional organic light emitting material is an oil-soluble organic material and is hardly soluble in a water-soluble organic solvent, the organic light emitting material of the organic light emitting layer 12 is not dissolved in the first solvent and not diffused to be mixed with the electron emitting layer material. In other embodiments, the first solvent may also be an oil-soluble organic solvent, and the organic light emitting material is insoluble or slightly soluble in the oil-soluble organic solvent. In other embodiments, the first solvent ink droplet 13 may also be formed on the organic light emitting layer 12 by coating or other means.

Figure 2D:
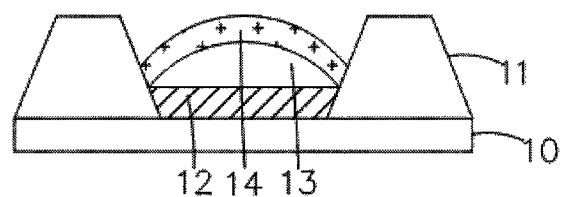

S103, referring to FIG. 2D, an electron transport layer ink droplet 14 is formed on the first solvent ink droplet 13, and the electron transport layer ink droplet 14 includes an electron transport layer material and a second solvent.

Specifically, the electron transport layer material and the second solvent are uniformly mixed to prepare an electron transport layer ink, and then the electron transport layer ink is sprayed onto the first solvent ink droplet 13 by inkjet printing to form an electron transport layer ink droplet 14. The electron transport layer material refers to a material having electron transport ability, in particular, a material whose electron mobility is greater than hole mobility, such as an electron-deficient heterocyclic organic it-conjugated material.

In one embodiment, the electron transport layer material includes, but is not limited to, tris(8-hydroxyquinoline) aluminum, 1,3,5-tris(1-phenyl-1H-benzimidazol-2-yl)benzene. The second solvent includes, but is not limited to, an aromatic benzene solvent, and the aromatic benzene solvent includes, but is not limited to, anisole, ethyl benzoate, benzyl alcohol, cyclohexylbenzene, etc. In other embodiments, the electron transport layer ink droplet 14 may also be formed one the first solvent ink droplets 13 by coating or other means.

In one embodiment, the first solvent may be miscible with the second solvent, and the first solvent may also be insoluble or slightly soluble with the second solvent. When the first solvent is miscible with the second solvent, for example, the first solvent is ethanol and the second solvent is benzyl alcohol, the electron transport layer ink droplets are sprayed onto the first solvent ink droplets, and the second solvent and the first solvent may be occurred in-situ mixing. The second solvent gradually is diffused to the first solvent. Since the electron transport layer material is insoluble in the first solvent, the electron transport layer material is not dissolved in the mixture of the first solvent and the second solvent, so the organic light emitting layer and the electron transport material are isolated by a mixture of the first solvent and the second solvent. Thus, the electron transport material and the organic light emitting material of the organic light emitting layer are not mixed. When the second solvent and the first solvent are insoluble or slightly soluble, for example, the first solvent is glycerol and the second solvent is cyclohexylbenzene, the second solvent isolates the electron transport layer ink and the organic light emitting layer and blocks the organic light emitting layer material from being mixed with the electron transport layer material.

Figure 2E:
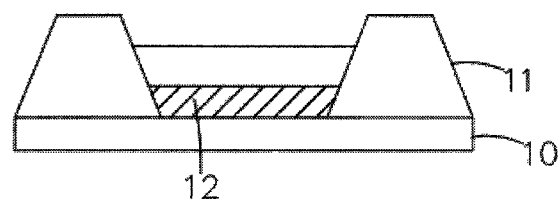
Figure 2F:
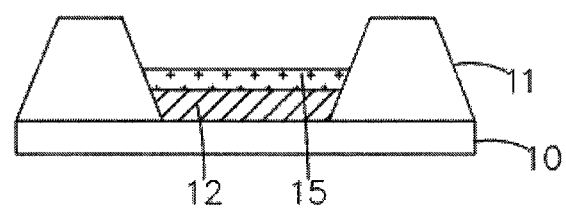

S104, referring to FIG. 2E and FIG. 2F, an electron transport layer 15 is formed on the organic light emitting layer by vacuum drying and heating to volatilize the first solvent and the second solvent sequentially.

Specifically, the electron transport layer ink droplets 14 is formed on the substrate in step S103, and the substrate having the electron transport layer ink droplets 14 is transferred to a drying chamber for drying, such as suction drying. That is, under a certain temperature and vacuum negative pressure, the first solvent and the second solvent are volatilized to form an electron transport layer having a specific shape as shown in FIG. 2E. Next, the substrate having the specific shape of electron transport layer is transferred to the heating stage for baking, and the remaining first solvent and the second solvent are removed to form the electron transport layer 15 on the organic light emitting layer 12 as shown in FIG. 2F.

In one embodiment, boiling point of the first solvent is higher than boiling point of the second solvent such that the first solvent may evaporate more slowly than the second solvent, so that the first solvent ink droplet 13 always has a function of isolating the organic light emitting layer 12 and the electron transport layer material. For example, the first solvent is glycerol, and the second solvent is cyclohexylbenzene.

An electron transport layer ink droplet is formed on a surface of the first solvent ink droplet by forming a first solvent ink droplet on a surface of the organic light emitting layer. Thus, the first solvent constituting the first solvent ink droplet and the second solvent of the electron transport layer ink droplet are evaporated to form the electron transport layer. The organic light emitting material is insoluble or slightly soluble in the first solvent, and the first solvent ink droplet acts as an isolation role between the organic light emitting layer and the electron transport layer ink droplet to prevent the organic light emitting material from being dissolved in the second solvent and mixed with the material of the electron transport layer. In addition, the method of manufacturing the organic light emitting diode display device has a simple process, and it is not necessary to develop a water/alcohol soluble electron transport material, and the advantage of preparing an electron transporting layer can be realized by using a conventional electron transporting material.

An organic light emitting diode display device includes:
a substrate having a plurality of pixel regions;
an organic light emitting layer formed on a pixel region of the substrate, and the organic light emitting layer comprises an organic light emitting material; and
an electron transport layer formed on the organic light emitting layer, and the electron transport layer forms a first solvent ink droplet through the organic light emitting layer, and an electron transport layer ink droplet is formed on the first solvent ink droplet by vacuum drying and heating the first solvent ink droplet and the electron transport layer ink droplet in sequentially to volatilize the first solvent of the first solvent ink droplet and the second solvent of the electron transport layer ink droplet, and the organic light emitting is insoluble or slightly soluble in the first solvent, and the electron transport layer ink droplet comprises an electron transport layer material.

Furthermore, the first solvent is a water-soluble organic solvent. The water-soluble organic solvent is selected from at least one of a monohydric alcohol, a polyhydric alcohol, a monobasic acid, and a polybasic acid. The monohydric alcohol includes, but is not limited to, ethanol, n-propanol, and isopropanol. The polyhydric alcohol includes, but is not limited to, ethylene glycol and glycerol. Since the conventional organic light emitting materials are oil-soluble organic materials and are hardly soluble in a water-soluble organic solvent, the organic light emitting materials in the organic light emitting layer are not dissolved to be mixed with the electron-emitting layer material. Since conventional organic light emitting material is an oil-soluble organic material and is hardly soluble in a water-soluble organic solvent, the organic light emitting material of the organic light emitting layer is not dissolved in the first solvent and not diffused to be mixed with the electron emitting layer material.

Furthermore, the second solvent selected from at least one of anisole, ethyl benzoate, benzyl alcohol, and cyclohexylbenzene.

In one embodiment, the first solvent may be miscible with the second solvent, and the first solvent may also be insoluble or slightly soluble with the second solvent. When the first solvent is miscible with the second solvent, for example, the first solvent is ethanol and the second solvent is benzyl alcohol, the electron transport layer ink droplets are sprayed onto the first solvent ink droplets, and the second solvent and the first solvent may be occurred in-situ mixing. The second solvent gradually is diffused to the first solvent. Since the electron transport layer material is insoluble in the first solvent, the electron transport layer material is not dissolved in the mixture of the first solvent and the second solvent, so the organic light emitting layer and the electron transport material are isolated by a mixture of the first solvent and the second solvent. Thus, the electron transport material and the organic light emitting material of the organic light emitting layer are not mixed. When the second solvent and the first solvent are insoluble or slightly soluble, for example, the first solvent is glycerol and the second solvent is cyclohexylbenzene, the second solvent isolates the electron transport layer ink and the organic light emitting layer and blocks the organic light emitting layer material from being mixed with the electron transport layer material.

Furthermore, boiling point of the first solvent is higher than boiling point of the second solvent such that the first solvent may evaporate more slowly than the second solvent, so that the first solvent ink droplet 13 always has a function of isolating the organic light emitting layer 12 and the electron transport layer material. For example, the first solvent is glycerol, and the second solvent is cyclohexylbenzene.

Furthermore, the first solvent ink droplet is formed by spraying, and the electron transport layer ink droplet is formed by spraying.

In the organic light emitting diode display device, a first solvent ink droplet is formed on the surface of the organic light emitting layer, and then an electron transport layer ink droplet is formed on the surface of the first solvent ink droplet. Thus, the first solvent constituting the first solvent ink droplet and the second solvent of the electron transport layer ink droplet are evaporated to form the electron transport layer. Since the organic light emitting material is insoluble or slightly soluble in the first solvent, the first solvent ink droplet acts as an isolation role between the organic light emitting layer and the electron transport layer ink droplet to prevent the organic light emitting material from being dissolved in the second solvent and mixed with the material of the electron transport layer.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. A method of manufacturing an organic light emitting diode display device, comprising following steps of:
    providing a substrate, wherein the substrate comprises a plurality of pixel regions;
    forming an organic light emitting layer on the pixel region of the substrate, wherein the organic light emitting layer comprises an organic light emitting material;
    forming a first solvent ink droplet on the organic light emitting layer, wherein the first solvent ink droplet comprises a first solvent, and the organic light emitting material is insoluble or slightly soluble in the first solvent;
    forming an electron transport layer ink droplet on the first solvent ink droplet, wherein the electron transport layer ink droplet comprises an electron transport layer material and a second solvent; and
    vacuum drying and heating to volatilize the first solvent and the second solvent sequentially, and forming an electron transport layer on the organic light emitting layer.

2. The method of manufacturing the organic light emitting diode display device according to claim 1, wherein the first solvent is a water-soluble organic solvent.

3. The method of manufacturing the organic light emitting diode display device according to claim 2, wherein the water-soluble organic solvent is selected from the group consisting of at least one of a monohydric alcohol, a polyhydric alcohol, a monobasic acid, and a polybasic acid.

4. The method of manufacturing the organic light emitting diode display device according to claim 2, wherein the water-soluble organic solvent comprises at least one of ethanol, n-propanol, ethylene glycol, and glycerol.

5. The method of manufacturing the organic light emitting diode display device according to claim 1, wherein the second solvent is selected from at least one of anisole, ethyl benzoate, benzyl alcohol, and cyclohexylbenzene.

6. The method of manufacturing the organic light emitting diode display device according to claim 1, wherein boiling point of the first solvent is higher than boiling point of the second solvent.

7. The method of manufacturing the organic light emitting diode display device according to claim 6, wherein the first solvent is glycerol and the second solvent is cyclohexylbenzene.

8. The method of manufacturing the organic light emitting diode display device according to claim 1, wherein the first solvent ink droplet is formed by spraying, and the electron transport layer ink droplet is formed by spraying.

9. The method of manufacturing the organic light emitting diode display device according to claim 1, wherein the first solvent is ethanol and the second solvent is benzyl alcohol.

10. An organic light emitting diode display device, comprising:
    a substrate, wherein the substrate comprises a plurality of pixel regions;
    an organic light emitting layer formed on a pixel region of the substrate, wherein the organic light emitting layer comprises an organic light emitting material; and
    an electron transport layer formed on the organic light emitting layer, wherein the electron transport layer forms a first solvent ink droplet through the organic light emitting layer, and an electron transport layer ink droplet is formed on the first solvent ink droplet by vacuum drying and heating the first solvent ink droplet and the electron transport layer ink droplet in sequentially to volatilize the first solvent of the first solvent ink droplet and the second solvent of the electron transport layer ink droplet; and wherein the organic light emitting material is insoluble or slightly soluble in the first solvent, and the electron transport layer ink droplet comprises an electron transport layer material.

11. The organic light emitting diode display device according to claim 10, wherein the first solvent is a water-soluble organic solvent.

12. The organic light emitting diode display device according to claim 11, wherein the water-soluble organic solvent is selected from at least one of a monohydric alcohol, a polyhydric alcohol, a monobasic acid, and a polybasic acid.

13. The organic light emitting diode display device according to claim 11, wherein the water-soluble organic solvent comprises at least one of ethanol, n-propanol, ethylene glycol, and glycerol.

14. The organic light emitting diode display device according to claim 10, wherein the second solvent is selected from at least one of anisole, ethyl benzoate, benzyl alcohol, and cyclohexylbenzene.

15. The organic light emitting diode display device according to claim 10, wherein boiling point of the first solvent is higher than boiling point of the second solvent.

16. The organic light emitting diode display device according to claim 15, wherein the first solvent is glycerol, and the second solvent is cyclohexylbenzene.

17. The organic light emitting diode display device according to claim 10, wherein the first solvent ink droplet is formed by spraying, and the electron transport layer ink droplet is formed by spraying.

18. The organic light emitting diode display device according to claim 10, wherein the first solvent is ethanol and the second solvent is benzyl alcohol.

* * * * *